United States Patent
Rastegar

(10) Patent No.: US 10,935,896 B2
(45) Date of Patent: Mar. 2, 2021

(54) CLEANING SOLUTION MIXING SYSTEM WITH ULTRA-DILUTE CLEANING SOLUTION AND METHOD OF OPERATION THEREOF

(71) Applicant: Applied Materials, Inc., Santa Clara, CA (US)

(72) Inventor: Abbas Rastegar, Schenectady, NY (US)

(73) Assignee: Applied Materials, Inc., Santa Clara, CA (US)

( * ) Notice: Subject to any disclaimer, the term of this patent is extended or adjusted under 35 U.S.C. 154(b) by 371 days.

(21) Appl. No.: 15/652,497

(22) Filed: Jul. 18, 2017

(65) Prior Publication Data

US 2018/0024447 A1    Jan. 25, 2018

Related U.S. Application Data

(60) Provisional application No. 62/366,231, filed on Jul. 25, 2016.

(51) Int. Cl.
*B08B 3/08*    (2006.01)
*G03F 7/20*    (2006.01)
(Continued)

(52) U.S. Cl.
CPC ...... *G03F 7/70925* (2013.01); *B01F 3/04439* (2013.01); *B01F 3/0803* (2013.01);
(Continued)

(58) Field of Classification Search
CPC ......... G03F 7/70925; G03F 1/82; C11D 3/04; C11D 11/0064; C11D 3/02; C11D 3/3942;
(Continued)

(56) References Cited

U.S. PATENT DOCUMENTS 5,039,349 A * 8/1991 Schoeppel ................ B08B 3/02
  134/108
5,287,060 A   2/1994 Reddy et al.
(Continued)

FOREIGN PATENT DOCUMENTS

CN    1536623 A   10/2004
CN  105593976 A    5/2016
(Continued)

OTHER PUBLICATIONS

Hydrogen peroxide—Wikipedia (Year: 2020).*
(Continued)

*Primary Examiner* — Alexander Markoff
(74) *Attorney, Agent, or Firm* — Servilla Whitney LLC

(57) ABSTRACT

Disclosed are a cleaning solution mixing system, a tool and a method of operation thereof, including an ultrapure water source for providing ultrapure water; an ammonia filter for filtering ammonia in gas form; a hydrogen peroxide filter for filtering hydrogen peroxide in gas form; an ammonia re-gas membrane for dissolving the ammonia in the ultrapure water and forming ultra-dilute ammoniated water; a hydrogen peroxide re-gas membrane for dissolving the hydrogen peroxide in the ultrapure water and forming ultra-dilute hydrogenated water; and a mixer for forming an ultra-dilute cleaning solution by mixing the ultra-dilute ammoniated water and the ultra-dilute hydrogenated water.

16 Claims, 3 Drawing Sheets

(51) Int. Cl.
*B01F 3/20* (2006.01)
*B01F 3/04* (2006.01)
*B01F 3/08* (2006.01)
*C11D 3/02* (2006.01)
*C11D 3/39* (2006.01)
*C11D 3/30* (2006.01)
*C11D 3/04* (2006.01)
*G03F 1/82* (2012.01)
*C11D 11/00* (2006.01)
*B08B 3/12* (2006.01)

(52) U.S. Cl.
CPC ............ *B01F 3/088* (2013.01); *B01F 3/2057* (2013.01); *B08B 3/08* (2013.01); *C11D 3/02* (2013.01); *C11D 3/04* (2013.01); *C11D 3/30* (2013.01); *C11D 3/3942* (2013.01); *C11D 11/0064* (2013.01); *G03F 1/82* (2013.01); *B08B 3/12* (2013.01)

(58) Field of Classification Search
CPC ...... C11D 3/30; B01F 3/2057; B01F 3/04439; B01F 3/0803; B01F 3/088; B08B 3/08; B08B 3/12
See application file for complete search history.

(56) References Cited

U.S. PATENT DOCUMENTS

| | | | | |
|---|---|---|---|---|
| 5,302,311 A * | 4/1994 | Sugihara | ............ | H01L 21/02052 252/186.29 |
| 5,578,273 A * | 11/1996 | Hanson | ............. | H01L 21/02052 422/110 |
| 5,855,792 A * | 1/1999 | Adams | ...................... | C02F 9/00 134/10 |
| 5,944,907 A * | 8/1999 | Ohmi | ........................ | B08B 3/12 134/1.3 |
| 5,962,384 A * | 10/1999 | Cooper | ................ | C11D 3/3947 510/175 |
| 6,082,373 A * | 7/2000 | Sakurai | ..................... | B08B 3/12 134/1 |
| 6,099,662 A * | 8/2000 | Wang | ................ | H01L 21/02065 134/26 |
| 6,191,085 B1 * | 2/2001 | Cooper | ................ | C11D 3/3947 510/175 |
| 6,202,658 B1 * | 3/2001 | Fishkin | ............. | H01L 21/67046 134/147 |
| 6,280,527 B1 * | 8/2001 | Sachdev | ................. | C11D 7/06 134/2 |
| 6,290,777 B1 * | 9/2001 | Imaoka | ..................... | B08B 3/08 134/1 |
| 6,351,871 B1 * | 3/2002 | Sachdev | ................. | C11D 7/06 134/103.1 |
| 6,450,181 B1 * | 9/2002 | Morita | ................. | C11D 3/0042 134/1.3 |
| 6,681,781 B2 * | 1/2004 | Puri | ......................... | B08B 3/08 134/1 |
| 6,799,583 B2 * | 10/2004 | Puri | ......................... | B08B 3/08 134/1.3 |
| 6,921,063 B2 * | 7/2005 | Ozawa | ................... | B01D 53/22 261/23.1 |
| 7,294,320 B2 * | 11/2007 | Pettibone | ............... | B01D 53/46 422/105 |
| 7,850,931 B2 * | 12/2010 | McDonnell | ............... | B08B 3/00 422/292 |
| 8,123,833 B2 * | 2/2012 | Morita | ............... | B01D 19/0036 134/10 |
| 2002/0024152 A1 | 2/2002 | Momoi et al. | | |
| 2003/0150477 A1 * | 8/2003 | Suzuki | ...................... | B08B 3/00 134/1.3 |
| 2004/0099290 A1 * | 5/2004 | Morinaga | ................. | B08B 3/08 134/27 |
| 2009/0078287 A1 * | 3/2009 | Kamikawa | ............... | B08B 3/00 134/18 |
| 2010/0043835 A1 * | 2/2010 | Eshima | ............. | H01L 21/67017 134/26 |
| 2012/0090649 A1 * | 4/2012 | Takahashi | ............ | G11B 5/8404 134/33 |
| 2015/0128994 A1 * | 5/2015 | Kaneko | ............... | H01L 21/0206 134/4 |
| 2015/0380280 A1 * | 12/2015 | Amiya | ................... | B01D 19/02 134/56 R |

FOREIGN PATENT DOCUMENTS

| | | |
|---|---|---|
| EP | 0560324 A1 | 9/1993 |
| JP | H06213847 A | 8/1994 |
| JP | H11176794 A | 7/1999 |
| TW | 405176 B | 9/2000 |
| TW | 200533429 A | 10/2005 |
| TW | 200930469 A | 7/2009 |

OTHER PUBLICATIONS

Tetramethylammonium hydroxide—Wikipedia (Year: 2020).*
PCT International Search Report and Written Opinion in PCT/US2017/042745 dated Nov. 2, 2017, 15 pages.
PCT International Preliminary Report on Patentability in PCT/US2017/042745 dated Feb. 7, 2019, 13 pages.

* cited by examiner

CLEANING SOLUTION MIXING SYSTEM WITH ULTRA-DILUTE CLEANING SOLUTION AND METHOD OF OPERATION THEREOF

CROSS-REFERENCE TO RELATED APPLICATIONS

This application claims priority to U.S. Provisional Application No. 62/366,231, filed Jul. 25, 2016, the entire disclosure of which is hereby incorporated by reference herein.

TECHNICAL FIELD

The present disclosure relates generally to a cleaning solution mixing system, and more particularly to a system for cleaning with ultra-dilute cleaning solutions.

BACKGROUND

Extreme ultraviolet lithography (EUVL, also known as soft x-ray projection lithography, and also abbreviated as EUV) is a contender to replace deep ultraviolet lithography for the manufacture of 14 nm, and smaller, minimum feature size semiconductor devices.

However, extreme ultraviolet light, which is generally in the 5 to 40 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor wafer.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light essentially at a single wavelength within an extremely narrow ultraviolet bandpass; e.g., 12 to 14 nanometer bandpass for 13 nanometer ultraviolet light.

There are various classes of defects in semiconductor processing technology which cause problems in masks. For example, opaque defects are typically caused by particles on top of the multilayer coatings or mask pattern which absorb light when it should be reflected. Clear defects are typically caused by pinholes in the mask pattern on top of the multilayer coatings through which light is reflected when it should be absorbed. Further, the thickness and uniformity of multilayer coatings require manufacturing precision to not distort the image produced by the final mask.

In the past, mask blanks for deep ultraviolet lithography have generally been made of glass but low thermal expansion materials have been proposed as alternatives for extreme ultraviolet lithography. Whether the blank is of glass or low thermal expansion material, the surface of the mask blank is made as smooth as possible by mechanical polishing with an abrasive. Another obstacle in mask blank creation includes scratches that are left behind in such a process are sometimes referred to as "scratch-dig" marks, and their depth and width depend upon the size of the particles in the abrasive used to polish the mask blank. For visible and deep ultraviolet lithography, these scratches are too small to cause phase defects in the pattern on the semiconductor wafer. However, for extreme ultraviolet lithography, scratch-dig marks are a significant problem because they will appear as phase defects.

Due to the short illumination wavelengths required for EUV lithography, the pattern masks used must be reflective masks instead of the transmissive masks used in current lithography. The reflective mask is made up of a precise stack of alternating thin layers of molybdenum and silicon, which creates a Bragg reflector or mirror. Because of the nature of the multilayer stack and the small feature size, any imperfections in the uniformity of the layers or the surface of the substrate on which the multilayer stack is deposited will be magnified and impact the final product. Imperfections on the scale of a few nanometers can show up as printable defects on the finished mask and need to be eliminated from the surface of the mask blank before deposition of the multilayer stack. Further, the thickness and uniformity of the deposited layers must meet very demanding specifications to not ruin the final completed mask.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

Embodiments of the disclosure provide a method of operation of a cleaning solution mixing system that includes providing ultrapure water from an ultrapure water source; filtering an amount of ammonia through an ammonia filter; filtering an amount of hydrogen peroxide through a hydrogen peroxide filter; forming ultra-dilute ammoniated water by dissolving the ammonia in the ultrapure water; forming ultra-dilute hydrogenated water by dissolving the hydrogen peroxide in the ultrapure water; and forming an ultra-dilute cleaning solution by mixing the ultra-dilute ammoniated water and the ultra-dilute hydrogenated water.

Additional embodiments of the disclosure provide the cleaning solution mixing system that includes an ultrapure water source for providing ultrapure water; an ammonia filter for filtering ammonia in gas form; a hydrogen peroxide filter for filtering hydrogen peroxide in gas form; an ammonia re-gas membrane for dissolving the ammonia in the ultrapure water and forming ultra-dilute ammoniated water; a hydrogen peroxide re-gas membrane for dissolving the hydrogen peroxide in the ultrapure water and forming ultra-dilute hydrogenated water; and a mixer for forming an ultra-dilute cleaning solution by mixing the ultra-dilute ammoniated water and the ultra-dilute hydrogenated water.

Certain embodiments of the disclosure include other steps or elements in addition to or in place of those mentioned above. The steps or element will become apparent to those skilled in the art from a reading of the following detailed description when taken with reference to the accompanying drawings.

DETAILED DESCRIPTION

Figure 1:
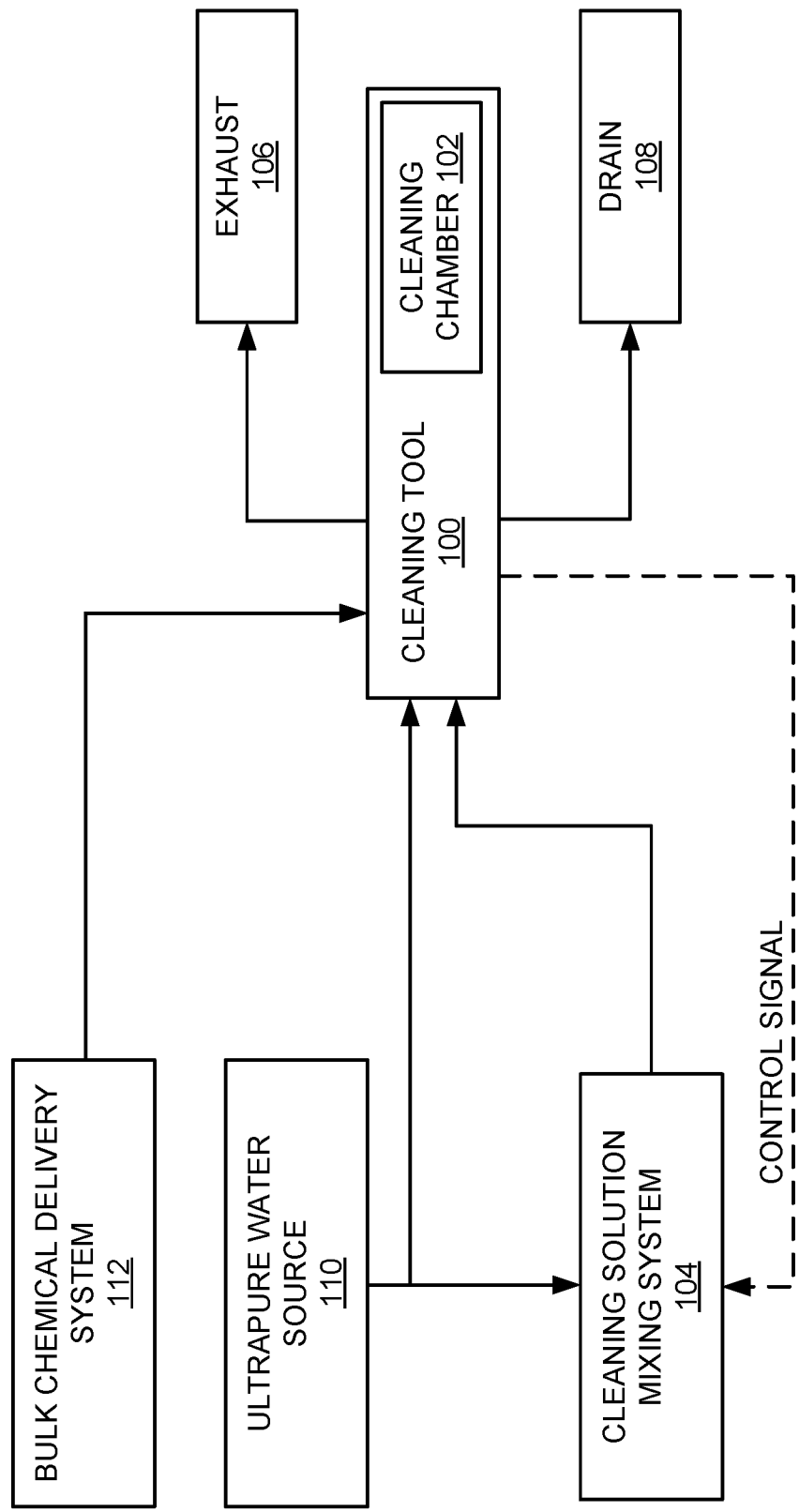
FIG. 1 is a block diagram of a cleaning tool in an embodiment of the present disclosure.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part.

The term "processing" as used herein includes deposition of material or photoresist, patterning, exposure, development, etching, cleaning, and/or removal of the material or photoresist as required in forming a described structure.

Referring now to FIG. 1, therein is shown a block diagram of a cleaning tool 100 in an embodiment of the present disclosure. The cleaning tool 100 can utilize an ultra-dilute cleaning solution produced by a cleaning solution mixing system 104 which can be connected to a cleaning chamber 102 within the cleaning tool 100. The cleaning solution mixing system 104 can also be called the ultra clean supply module. The cleaning solution mixing system 104 is shown as separate from the cleaning tool 100 in this example, but it is understood that the cleaning solution mixing system 104 can also be integrated with the cleaning tool 100. If the cleaning solution mixing system 104 is separate from the cleaning tool 100, it is also possible for the cleaning solution mixing system 104 to support multiple cleaning tools, for example.

Both the cleaning tool 100 and the cleaning solution mixing system 104 can be supplied with ultrapure water by an ultrapure water source 110. The term "ultrapure" refers to purity and is quantified by the number of dissolved ions in water. This can be determined by conductivity, which for ultrapure water is 18.2 megohm (18.2 million ohm). Metallic ion concentration of ultrapure water can be at a ppm level. The cleaning tool 100 can also be supplied with necessary chemicals by a bulk chemical delivery system 112. The cleaning tool 100 or the cleaning chamber 102 can send control signals to the cleaning solution mixing system 104 in order to control output of the ultra-dilute cleaning solution. "Ultra-dilute" is defined as a concentration of no greater than 100 ppm. The cleaning tool 100 can also be equipped with an exhaust 106 which can also include a scrubber and a drain 108 which are connected to the cleaning chamber 102. The scrubber and drain can also be external to the cleaning tool 100.

Figure 2:
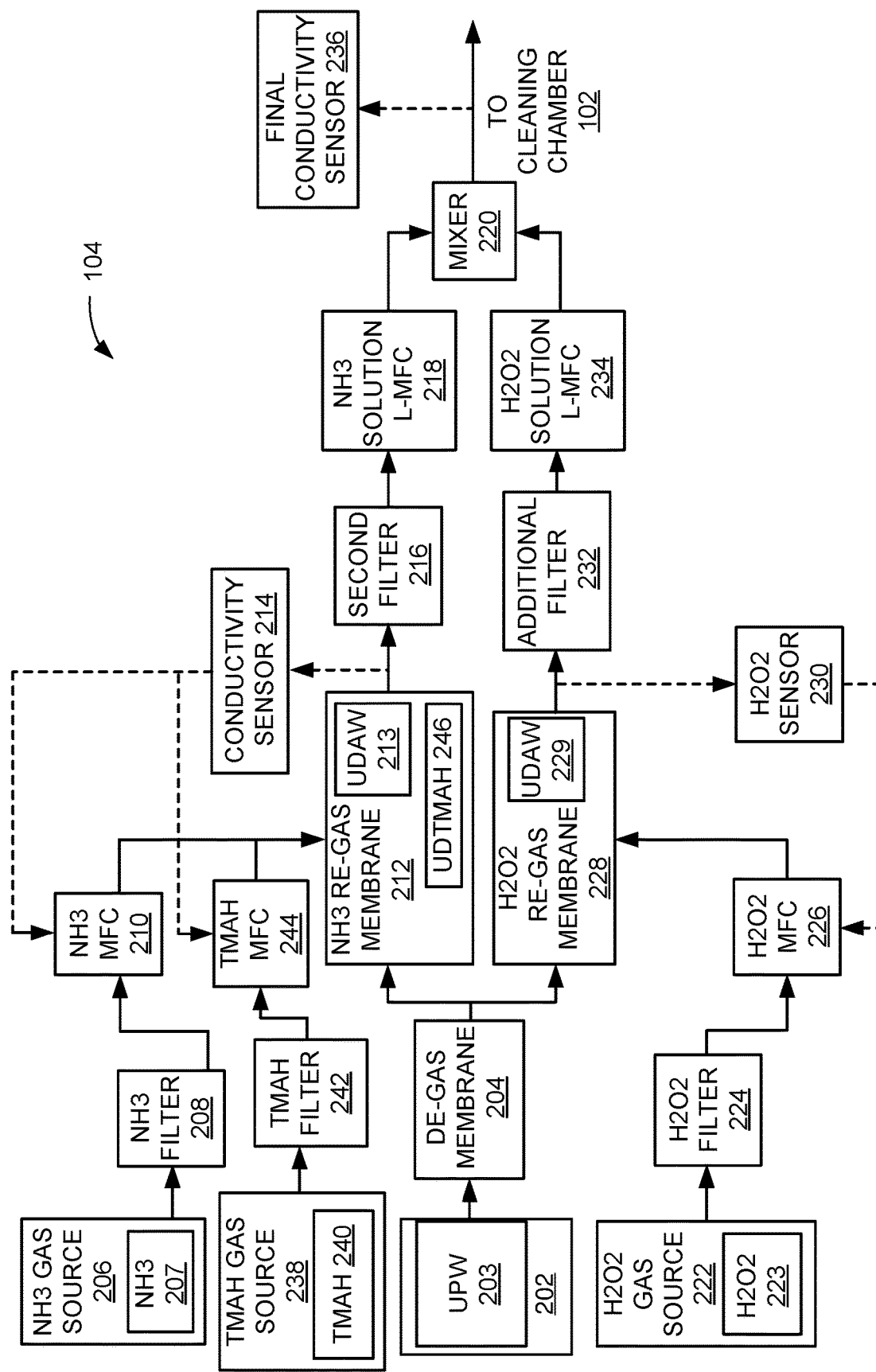
FIG. 2 is a system diagram of the cleaning solution mixing system connected to the cleaning chamber of FIG. 1 of the cleaning tool of FIG. 1.

Referring now to FIG. 2, therein is shown a system diagram of the cleaning solution mixing system 104 connected to the cleaning chamber 102 of FIG. 1 of the cleaning tool 100 of FIG. 1. The cleaning solution mixing system 104 contains two interlinked systems for generating ultra-dilute mixtures of ammonium hydroxide and hydrogen peroxide for cleaning EUV mask blanks.

During megasonic cleaning, it is common to use high pH solutions such as the aforementioned mixture of ammonium hydroxide and hydrogen peroxide solution with water. Such mixtures typically have a pH greater than nine and therefore, zeta potential of surfaces in contact with these solutions are usually negative. Hence, when a particle is separated from the surface by a cavitation event, it will not be redeposited back on the surface. Thus, these solutions are very effective when used in conjunction with megasonic cleaning for removing any contaminating particles from the surface of an EUV mask.

However, EUV masks are so sensitive to particle defects that even a particle with a size of 12 nm on an EUV mask substrate can lead to a defect in the final product. Typical cleaning solutions cannot remove enough of the particles to avoid defects and can leave particles with sizes as large as 100 nm. Embodiments of the disclosure provide a specific mixing and supply tool for removing far more of these particles than any existing techniques or tools.

The cleaning solution mixing system 104 starts with ultrapure water 203 from the ultrapure water source 110 of FIG. 1 being sent through a de-gas membrane 204 in order to further remove any potential contaminants from the ultrapure water 203, to remove excess gas and to ensure that any gases dissolved in solution are there for a purpose and not by accident. The de-gas membrane 204 and any other de-gas membrane can have a pore size of 5 nm to 100 nm, alternatively, less than 5 nm, with the size chosen dependent on the gas the membrane is intended to filter. An ammonia gas source 206 provides and sends ammonia 207 ($NH_3$) in gas form through an ammonia filter 208 and then to an ammonia mass flow controller 210. The ammonia mass flow controller 210 regulates the amount of ammonia gas which reaches an ammonia re-gas membrane 212. At the ammonia re-gas membrane 212, the ultrapure water 203 from the ultrapure water source 202 is combined with the ammonia 207 from the ammonia gas source 206 at a carefully controlled ratio regulated by the ammonia mass flow controller 210 to form ultra-dilute ammoniated water 213. Concentration of the ammonia 207 in the ultra-dilute ammoniated water 213 can range from 1 ppm to 100 ppm. The ultra-dilute ammoniated water 213 having a concentration of the ammonia 207 of 5 ppm has been found to effectively clean a quartz surface while avoiding surface contamination.

The ammonia mass flow controller 210 allows for the preparation of the ultra-dilute ammoniated water 213 which can be used in mega sonic cleaning without the worry of contaminating the surface of the EUV mask with ammonium ions. Excess ammonium ions are known to lead to a haze problem on masks which are cleaned with ammoniated water. The ultra-dilute ammoniated water 213 continues on to a second filter 216 for further filtering of the ultra-dilute ammoniated water. Prior to reaching the second filter 216, the ultra-dilute ammoniated water 213 passes through or by a conductivity sensor 214. The conductivity sensor 214 can provide feedback to the ammonia mass flow controller 210 regarding the concentration of the ammonia 207 in the ultra-dilute ammoniated water 213 and allow for the ammonia mass flow controller 210 to control the concentration of the ammonia 207 to the granularity of parts per million (ppm).

The cleaning solution mixing system 104 can also include a tetramethyl ammonium hydroxide (TMAH, also represented by the chemical formula $N(CH_3)_4{}^+OH^-$) gas source 238 to provide an amount of tetramethyl ammonium hydroxide 240 as a gas which is filtered through a tetramethyl ammonium hydroxide filter 242 and then to a tetramethyl ammonium hydroxide mass flow controller 244. The tetramethyl ammonium hydroxide mass flow controller 244 regulates the amount of tetramethyl ammonium hydroxide which reaches the ammonia re-gas membrane 212. At the ammonia re-gas membrane 212, the ultrapure water 203 from the ultrapure water source 202 is combined with the tetramethyl ammonium hydroxide 240 from the tetramethyl ammonium hydroxide gas source 238 at a carefully controlled ratio regulated by the tetramethyl ammonium hydroxide mass flow controller 244 to form ultra-dilute tetramethyl ammonium hydroxide water 246.

At the same time, the cleaning solution mixing system 104 can utilize a hydrogen peroxide gas source 222 to provide hydrogen peroxide 223 ($H_2O_2$) as a gas through a hydrogen peroxide filter 224 and then to a hydrogen peroxide mass flow controller 226. The hydrogen peroxide mass flow controller 226 regulates the amount of hydrogen peroxide gas which reaches a hydrogen peroxide re-gas membrane 228. At the hydrogen peroxide re-gas membrane 228, the ultrapure water 203 from the ultrapure water source 202 is combined with the hydrogen peroxide 223 from the hydrogen peroxide gas source 222 at a carefully controlled ratio regulated by the hydrogen peroxide mass flow controller 226 in order to form ultra-dilute hydrogenated water 229. The concentration of the hydrogen peroxide 223 has been found to work best at a level which is two to three times the concentration of the ammonia 207. The hydrogen peroxide gas source 222 can receive feedback from the conductivity sensor 214 about the concentration of the ammonia 207 in the ultra-dilute ammoniated water 213 in order to tailor the amount of hydrogen peroxide 223 to match with the concentration of the ammonia 207.

The hydrogen peroxide mass flow controller 226 allows for the preparation of the ultra-dilute hydrogenated water 229 which can be used in mega sonic cleaning in conjunction with the ultra-dilute ammoniated water 213 to effectively remove particles even with sizes below 100 nm. The ultra-dilute hydrogenated water 229 continues on to an additional filter 232 for further filtering. Prior to reaching the additional filter 232, the ultra-dilute hydrogenated water 229 passes through or by a hydrogen peroxide sensor 230. The hydrogen peroxide sensor 230 can provide feedback to the hydrogen peroxide mass flow controller 226 regarding the concentration of the hydrogen peroxide 223 in the ultra-dilute hydrogenated water 229. This allows for control of the concentration of the hydrogen peroxide 223 by the hydrogen peroxide mass flow controller 226 to the granularity of parts per million (ppm).

Once the ultra-dilute ammoniated water 213 has passed through the second filter 216, the flow is gated by an ammonia solution liquid mass flow controller 218. The ammonia liquid mass flow controller feeds into a mixer 220. The ultra-dilute hydrogenated water 229 is similarly sent through the additional filter 232 and the flow is controlled by a hydrogen peroxide solution liquid mass flow controller 234. The hydrogen peroxide solution liquid mass flow controller 234 also feeds into the mixer 220. The mixer 220 can combine the ultra-dilute ammoniated water 213 and the ultra-dilute hydrogenated water 229 in the proper ratio for the most effective cleaning, and the resulting ultra-dilute cleaning solution is sent to a cleaning chamber in the cleaning tool 100. The concentration of the hydrogen peroxide 223 in the ultra-dilute hydrogenated water 229 provides superior cleaning power when it is combined with the ultra-dilute ammoniated water 213 at a level which is two to three times the concentration of the ammonia 207.

Before being sent to the cleaning tool 100, the ultra-dilute cleaning solution which is the mixture of at least the ultra-dilute ammoniated water 213 and the ultra-dilute hydrogenated water 229 is checked by a final conductivity sensor 236 to ensure the proper concentration of the solutes is met. If the final conductivity sensor 236 determines that the readings are as expected, the ultra-dilute cleaning solution is finally sent to the cleaning tool 100. The ultra-dilute cleaning solution may also be a mixture of the ultra-dilute ammoniated water 213 and the ultra-dilute hydrogenated water 229 combined in specific ratios.

The cleaning solution mixing system 104 can also generate an ultra-dilute solution which is an ultra-dilute mixture of ammonium hydroxide and hydrogen peroxide (APM), also known by the chemical formulas of $NH_4(OH)/H_2O2/H_2O$. This cleaning solution has been found to also be effective at cleaning EUV mask blanks with minimal etching of the EUV mask surface.

The ultra-dilute tetramethyl ammonium hydroxide water 246 has been found to be useful when more aggressive cleaning is required as compared to the ultra-dilute cleaning solution. The ultra-dilute tetramethyl ammonium hydroxide water 246 can have better cleaning efficiency than the ultra-dilute cleaning solution, and is generally suited to earlier cleaning steps to remove larger particles. The ultra-dilute cleaning solution is not as aggressive, and can be used to remove the last particles from an EUV mask blank in a safe manner with minimal etching of the surface, which could introduce new defects. The use of the ultra-dilute tetramethyl ammonium hydroxide water 246 is determined based on the needs of the process.

It has been discovered that mixing the ultra-dilute ammoniated water 213 and the ultra-dilute hydrogenated water 229 using the mixer 220 can improve removal of particles during cleaning of a size smaller than other techniques. The ammonia mass flow controller 210 can control how much of the ammonia 207 is dissolved in the ultrapure water 203 in order to form the ultra-dilute ammoniated water 213, which has been found to effectively clean even very small particles when used in conjunction with the ultra-dilute hydrogenated water 229.

It has also been discovered that filtering both the ammonia 207 and the hydrogen peroxide 223 through their respective filters allows for minimal contamination of the ultra-dilute ammoniated water 213 and the ultra-dilute hydrogenated water 229. The ammonia filter 208 and the hydrogen peroxide filter 224 can both have a pore size of less than 5 nm, for example, as low as 3 nm, because the filters will be filtering only gases. The second filter 216 and the additional filter 232 further ensure that the ultra-dilute cleaning solution formed of the ultra-dilute ammoniated water 213 and the ultra-dilute hydrogenated water 229 is as free of particular contaminants as possible.

It has been discovered that interlinking the systems for producing the ultra-dilute ammoniated water 213 and the ultra-dilute hydrogenated water 229 allows for better quality control and simplified manufacturing. Because the systems are interlinked, there only needs to be one of the ultrapure water source 202 which can be used for separately dissolving both the ammonia 207 and the hydrogen peroxide 223. This avoids the problem of extraneous transport of the ultrapure water 203; the more distance the ultrapure water 203 must cross, the higher the likelihood of contamination. Additionally, because the systems are interlinked and within the same system, it is simple to have both the ultra-dilute ammoniated water 213 and the ultra-dilute hydrogenated water 229 connected to the mixer 220, and the mixer 220 can carefully control the amount of the ultra-dilute cleaning solution sent to the cleaning chamber and ensure that no further steps are required to create the ultra-dilute cleaning solution.

Figure 3:
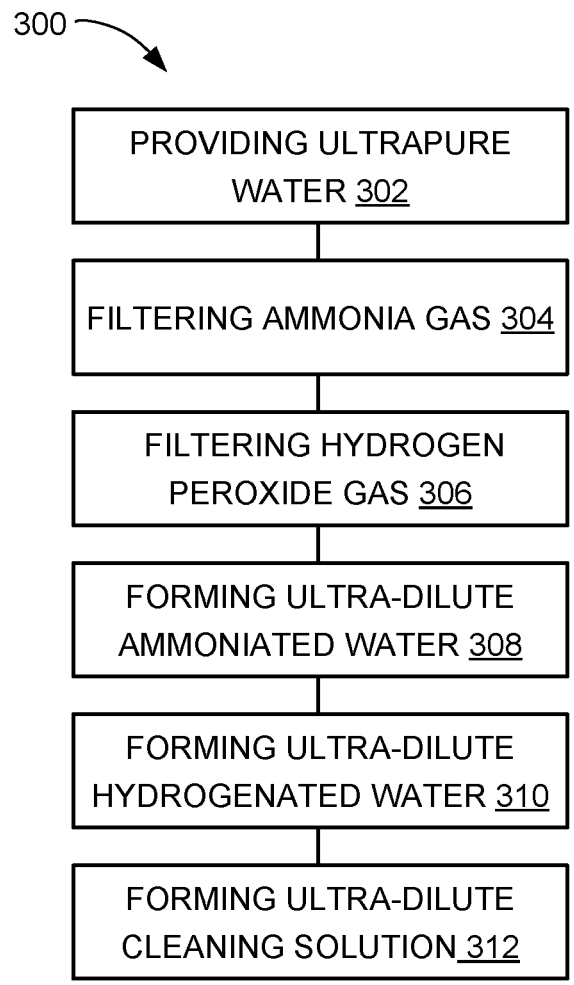
FIG. 3 is a flow chart of a method of operation of a cleaning solution mixing system in a further embodiment of the present disclosure.

Referring now to FIG. 3, therein is shown a flow chart of a method 300 of operation of a cleaning solution mixing system in a further embodiment of the present disclosure. The method 300 includes: providing ultrapure water from an ultrapure water source in a block 302; filtering an amount of ammonia through an ammonia filter in a block 304; filtering an amount of hydrogen peroxide through a hydrogen peroxide filter in a block 306; forming ultra-dilute ammoniated water by dissolving the ammonia in the ultrapure water in a block 308; forming ultra-dilute hydrogenated water by dissolving the hydrogen peroxide in the ultrapure water in a block 310; and forming an ultra-dilute cleaning solution by mixing the ultra-dilute ammoniated water and the ultra-dilute hydrogenated water in a block 312.

Embodiments of the proposed method, process, apparatus, device, product, and/or system are straightforward, cost-effective, uncomplicated, highly versatile, accurate, sensitive, and effective, and can be implemented by adapting known components for ready, efficient, and economical manufacturing, application, and utilization.

One or more embodiments reduce costs of the process, apparatus, device, product, and/or system, providing simplified operation, and improved performance.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of operation of a cleaning solution mixing system comprising:
   providing ultrapure water from an ultrapure water source;
   filtering an amount of ammonia gas through an ammonia filter;
   filtering an amount of hydrogen peroxide gas through a hydrogen peroxide filter;
   forming ultra-dilute ammoniated water by dissolving the ammonia gas in a first portion of the ultrapure water;
   separately dissolving the hydrogen peroxide gas in a second portion of the ultrapure water to provide dissolved hydrogen peroxide gas in the second portion of the ultrapure water; and
   forming an ultra-dilute cleaning solution by mixing the ultra-dilute ammoniated water and the dissolved hydrogen peroxide gas in the second portion of the ultrapure water.

2. The method as claimed in claim 1 further comprising:
   filtering an amount of tetramethyl ammonium hydroxide gas through a tetramethyl ammonium hydroxide filter;
   combining the tetramethyl ammonium hydroxide gas with the first portion of the ultrapure water; and
   regulating the amount of tetramethyl ammonium hydroxide gas dissolved in the first portion of the ultrapure water using a tetramethyl ammonium hydroxide mass flow controller.

3. The method as claimed in claim 1 further comprising filtering the dissolved hydrogen peroxide gas in the second portion of the ultrapure water through an additional filter.

4. The method as claimed in claim 1 further comprising regulating the amount of the ammonia gas dissolved in the first portion of the ultrapure water using an ammonia mass flow controller.

5. The method as claimed in claim 1 further comprising regulating the amount of the hydrogen peroxide gas dissolved in the second portion of the ultrapure water using a hydrogen peroxide mass flow controller.

6. The method as claimed in claim 1 further comprising regulating the amount of the ammonia gas dissolved in the first portion of the ultrapure water using a conductivity sensor connected to an ammonia mass flow controller.

7. The method as claimed in claim 1 further comprising regulating the amount of the hydrogen peroxide gas dissolved in the second portion of the ultrapure water using a hydrogen peroxide sensor connected to a hydrogen peroxide mass flow controller.

8. The method as claimed in claim 1, further comprising regulating the amount of the hydrogen peroxide gas dissolved in the second portion of the ultrapure water using a hydrogen peroxide sensor connected to a hydrogen peroxide mass flow controller, regulating the amount of the ammonia gas dissolved in the first portion of the ultrapure water using a conductivity sensor connected to an ammonia mass flow controller, and mixing the ultra-dilute ammoniated water and the dissolved hydrogen peroxide gas in the second portion of the ultrapure water in a controlled ratio.

9. The method as claimed in claim 8, wherein the concentration of the hydrogen peroxide gas is two to three times the concentration of the ammonia gas in the mixture.

10. The method as claimed in claim 2, further comprising combining the tetramethyl ammonium hydroxide and the first portion of the ultrapure water to form ultra-dilute tetramethyl ammonium hydroxide water combined with the ultra-dilute ammoniated water at a membrane before forming an ultra-dilute cleaning solution by mixing the ultra-dilute ammoniated water, and the and the dissolved hydrogen peroxide gas in the second portion of the ultrapure water.

11. The method as claimed in claim 9, wherein the ammonia filter has a pore size of less than 5 nm.

12. The method as claimed in claim 11, wherein the hydrogen peroxide filter has a pore size of less than 5 nm.

13. The method as claimed in claim 9, further comprising checking the ultra-dilute cleaning solution with a conductivity sensor.

14. The method as claimed in claim 9, further comprising passing the ultra-dilute ammoniated water though a conductivity sensor and providing feedback to the ammonia mass flow controller regarding the concentration of ammonia gas in the ultra-dilute ammoniated water to allow for the ammonia mass flow controller to control concentration of the ammonia gas.

15. The method as claimed in claim 14, further comprising passing the hydrogen peroxide gas dissolved in the second portion of the ultrapure water though a hydrogen peroxide sensor and providing feedback to the hydrogen peroxide mass flow controller regarding the concentration of hydrogen peroxide gas in the second portion of the ultrapure water to allow for the hydrogen peroxide flow controller to control concentration of the hydrogen peroxide gas.

16. The method as claimed in claim 15, further comprising checking the ultra-dilute cleaning solution with a conductivity sensor.

* * * * *

UNITED STATES PATENT AND TRADEMARK OFFICE
CERTIFICATE OF CORRECTION

PATENT NO. : 10,935,896 B2
APPLICATION NO. : 15/652497
DATED : March 2, 2021
INVENTOR(S) : Abbas Rastegar It is certified that error appears in the above-identified patent and that said Letters Patent is hereby corrected as shown below:

In the Claims

Claim 10, Column 8, Line 34, delete repetitive words "and the".

Claim 14, Column 8, Line 46, replace "though" with "through".

Claim 15, Column 8, Line 54, replace "though" with "through".

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*